United States Patent
Tse et al.

(10) Patent No.: US 8,595,670 B1
(45) Date of Patent: Nov. 26, 2013

(54) METHOD AND APPARATUS FOR CIRCUIT BLOCK RECONFIGURATION EDA

(75) Inventors: John Tse, San Jose, CA (US); Neville Carvalho, Campbell, CA (US)

(73) Assignee: Altera Corporation, San Jose, CA (US)

( * ) Notice: Subject to any disclaimer, the term of this patent is extended or adjusted under 35 U.S.C. 154(b) by 155 days.

(21) Appl. No.: 12/719,298

(22) Filed: Mar. 8, 2010

(51) Int. Cl.
*G06F 17/50* (2006.01)

(52) U.S. Cl.
USPC ........... 716/116; 716/100; 716/103; 716/104; 716/117

(58) Field of Classification Search
USPC .......... 716/116–117, 100, 103, 104, 137–138
See application file for complete search history.

(56) References Cited

U.S. PATENT DOCUMENTS

| | | | | |
|---|---|---|---|---|
| 5,430,734 A | * | 7/1995 | Gilson | 714/725 |
| 5,752,006 A | * | 5/1998 | Baxter | 703/14 |
| 5,802,290 A | * | 9/1998 | Casselman | 709/201 |
| 5,946,219 A | * | 8/1999 | Mason et al. | 716/117 |
| 6,487,709 B1 | * | 11/2002 | Keller et al. | 716/117 |
| 6,675,306 B1 | * | 1/2004 | Baxter | 713/400 |
| 7,598,768 B1 | * | 10/2009 | Tetzlaff et al. | 326/38 |
| 7,737,723 B1 | * | 6/2010 | Tang et al. | 326/38 |
| 7,788,625 B1 | * | 8/2010 | Donlin et al. | 716/109 |
| 8,069,428 B1 | * | 11/2011 | Ogami et al. | 716/117 |
| 8,191,020 B1 | * | 5/2012 | Perry et al. | 716/104 |

* cited by examiner

*Primary Examiner* — Stacy Whitmore
(74) *Attorney, Agent, or Firm* — Mauriel Kapouytian Woods LLP; Michael Mauriel

(57) ABSTRACT

Methods and apparatus are described for efficiently performing EDA processing to arrive at a hardware definition for a varying fraction of a large circuit design. EDA processing is conducted targeting a pseudo hardware device with sufficient capacity to embody circuitry for the varying fraction, but substantially less than the true hardware target. The novel methods and apparatus may be beneficially employed to produce reconfiguration information for circuits that include programmable logic, for example.

28 Claims, 6 Drawing Sheets

METHOD AND APPARATUS FOR CIRCUIT BLOCK RECONFIGURATION EDA

BACKGROUND

Programmable logic devices (PLDs) are widely used in the electronics industry for their many advantages. The usability of a particular PLD may be determined as much by the electronic design automation (EDA) computer systems used to customize its operation for the user as by the resources and capabilities of the hardware itself. EDA systems have displaced the need for a user to know or understand the specifics of the circuitry in the hardware device. The user is shielded from this minutia by the EDA system which accepts a more generic, higher-level version of a circuit design from the user and transforms it to an implementation of the hardware device, taking into consideration all of the details, constraints, dependencies, and restrictions of the device in the process. The magnitude of the work performed by the EDA system in this regard is formidable as evidenced by the intensive computing resources required to compile a user design. And if the user makes a change to the design, even a small one, that considerable work is performed again, as modern EDA compiler theory and design does not assume (or even identify) the benign or limited nature of any design change but rather treats the changed design as a potential opportunity to arrive at an even greater optimization in a hardware implementation. Sometimes, however, a user may have design variations or alternatives that can be reasonably expected to have an obvious and limited impact in the hardware implementation. Until now, however, means were unavailable for a user to determine the differences in alternative hardware implementations in a resource-conserving way.

SUMMARY

Apparatus and method are disclosed that enable generating small sets of dynamic reconfiguration data for PLD circuits and certain dynamic reconfiguration capability. Apparatus is disclosed related to the recording of a description for a pseudo PLD device in machine readable form, based at least in part on customization information for a circuit block in the pseudo device. The pseudo PLD device is related to a family of one or more physical devices. The circuit block accommodates a dynamic reconfiguration operation, and processing of the recorded description results in the output of the data for dynamic reconfiguration.

Further, methods are disclosed related to eliciting and receiving information from a user about an alternative operating configuration for a circuit block. The information from the user is used to describe an implementation of a pseudo device that is related to one or more actual devices. The description of the implementation is then processed so that data for the dynamic reconfiguration of the circuit block is output.

Further, articles are disclosed which facilitate the practice of the aforementioned methods by electronic data processing means.

These and other aspects of the inventive subject matter disclosed herein will become apparent to one of skill in the art after consideration of the drawings and description that follow.

DETAILED DESCRIPTION

Figure 1:
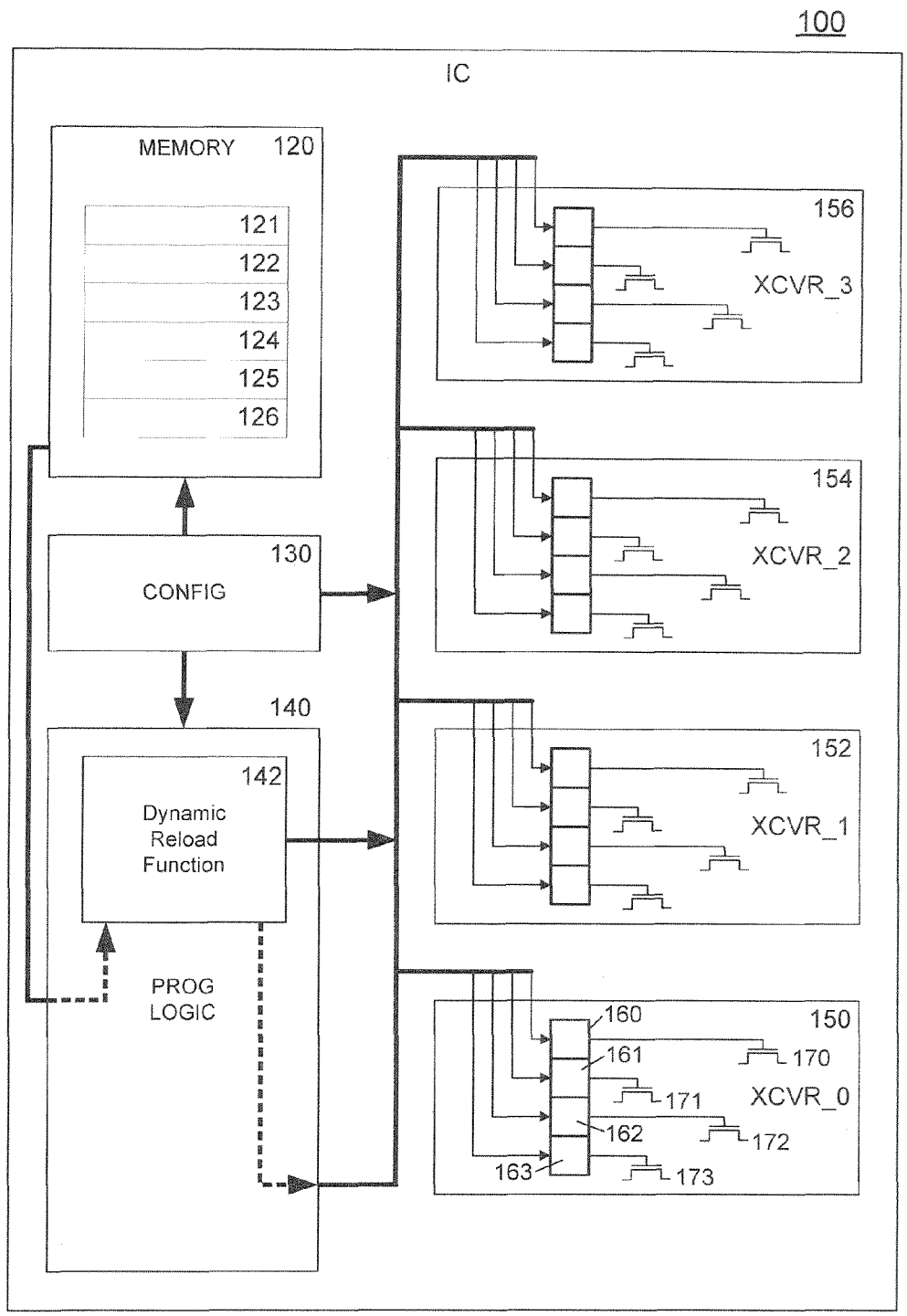
FIG. 1 is a functional block diagram of certain circuitry within a PLD integrated circuit.

FIG. 1 is a functional block diagram of certain circuitry within a PLD integrated circuit. Programmable logic device (PLD) integrated circuits are well known in the art. Many different types are known and available and examples include FPGAs, CPLDs, gate arrays, macrocell arrays, and structured logic arrays. For the discussion of FIG. 1, integrated circuit 100 is generally described as an FPGA device using volatile memory elements to store the configuration information that determines functional circuit operation. Members of the Stratix, Arria, and Cyclone families of devices from Altera Corporation, San Jose, Calif., are examples of such devices that enjoy popular commercial use.

Between the time the chip 100 is powered on and the time it begins its main functional operation, a configuration operation is performed that loads the configuration information into these volatile memory elements. Such a configuration operation is an initial configuration and may be performed by dedicated, fixed circuitry for that purpose on the chip, such as configuration circuit block 130. Subsequent to the initial configuration, the configuration memory elements may be reloaded in a reconfiguration operation. For example, signaling a device reset operation may cause reconfiguration. It is possible to include in the design of a device the possibility to perform a reload of some fraction of the configuration memory elements, for example, a particular quadrant of the chip. Whether full or partial reconfiguration of the chip is performed, the affected circuitry has its operation isolated or suspended to prevent the generation and propagation of random and erroneous signals inside and outside the chip.

Memory elements other than those that define the functional operation of the circuitry may also be loaded during a configuration process. For example, circuitry that is configured to operate as a particular block of memory in the configured user design may have initial values loaded into it, such as all zeros or a set of ROM lookup table values. Memory 120 depicts such a block. Certain memory elements in block 120 are strictly configuration memory elements that define the functional operation of the circuit block and specify for example data width, memory mode, or read/write ability. The configuration memory elements of 120 are not separately shown. These configuration memory elements are written to only during a configuration operation by configuration circuitry and are not visible to the logic of the implemented user design. Other memory elements in block 120 are user-mode data memory elements that may be written to during a configuration operation for initialization, but are readily visible and accessible to the logic of the implemented user design. User-mode data memory units are shown as blocks 121-126.

IC 100 of FIG. 1 depicts yet a third class of memory elements within the PLD. Memory elements in each of transceivers 150-156 are like previously discussed configuration memory elements in that their stored contents are used to define the functional operation of a transceiver circuit block. For example, memory elements 160-163 (collectively, a control register) apply their stored values to control connections on circuit elements 170-173, respectively, to effect certain operational options for XCVR_0 (150). For example, circuit element 170, controlled by the value stored in control register element 160, may be employed to selectively gate the signal from a particular clock source to a clock input of receiver circuitry within circuit block 150. Unlike previously discussed configuration memory elements, memory elements 160-163 may be visible and accessible to the logic of an implemented user design. Accordingly, programmable logic such as block 140 of PLD 100 may include a portion, such as block 142, that is configured to perform a dynamic reconfiguration function on one or more of transceivers 150-156. This dynamic reconfiguration function is performed while the chip is operating in user mode in accordance with the user design, apart from the configuration (or reconfiguration) processes performed by configuration circuitry 130.

One of skill in the art understands that FIG. 1 is a simplified block diagram not intended to convey circuitry details or design requirements. One of skill will appreciate, for example, that although the memory elements for a control register may be shown side-by-side, such as elements 160-163 of the control register for transceiver 150, multiple memory elements in a particular implementation need not always be adjacent physically, circuit-wise, or access-wise (e.g., adjacent elements in a shift register). A control register may include a dispersed and disparate collection of memory elements, or a single memory element.

Configuration block 130, as previously noted, includes dedicated circuitry that operates to configure or reconfigure IC 100, typically as part of a power-on or a device reset operation. Configuration block 130 suspends normal chip operation to prevent random, unpredictable, and erroneous results, and then reads configuration information from an external memory device, loading it into the configuration memory elements of IC 100. When all the configuration data has been loaded and possibly verified, configuration block 130 completes its active operation by resuming normal (i.e., user mode) chip operation. At that point the chip circuitry begins operation in accordance with the user design.

Programmable logic block 140 includes a large number of programmable logic elements and programmable routing resources to interconnect the logic elements. Each programmable logic element is capable of performing a variety of logical functions on its inputs, and information stored in its configuration memory elements select the particular logical function performed in a given instance.

The data loaded into memory elements during a configuration operation may be preferably stored in a nonvolatile memory device external to the FPGA-type PLD device such as IC 100. Such configuration information is preferably produced using electronic design automation (EDA), where a user can express the design intention for a circuit in high-level, intuitive, and human-understandable form, and the EDA computing apparatus can predictably and reliably translate the user expression into a very exacting pattern of information bits that can be used to configure a particular PLD to operate according to the user's design intention. An example of such an EDA system for producing a complete configuration file to load into an FPGA device is the Quartus II software from Altera Corporation, San Jose, Calif., executing on compatible hardware.

Up until now, EDA systems produced configuration information files representing complete user designs for configuring all or a substantial fraction of the chip using the dedicated configuration circuitry. While these configuration information files may have contained within them configuration information destined for a particular control register of a particular circuit block, that information was either not available separately from the rest of the design or required processing of a substantial portion of the design to produce it. Because processing (compiling) a design targeted to a full PLD chip consumes great amounts of computing resources, users wanting to determine control register information patterns for many different reconfiguration options expended tremendous computing resources or could attempt manual or computer-based methods that were inherently unreliable or in need of regular maintenance.

Figure 2:
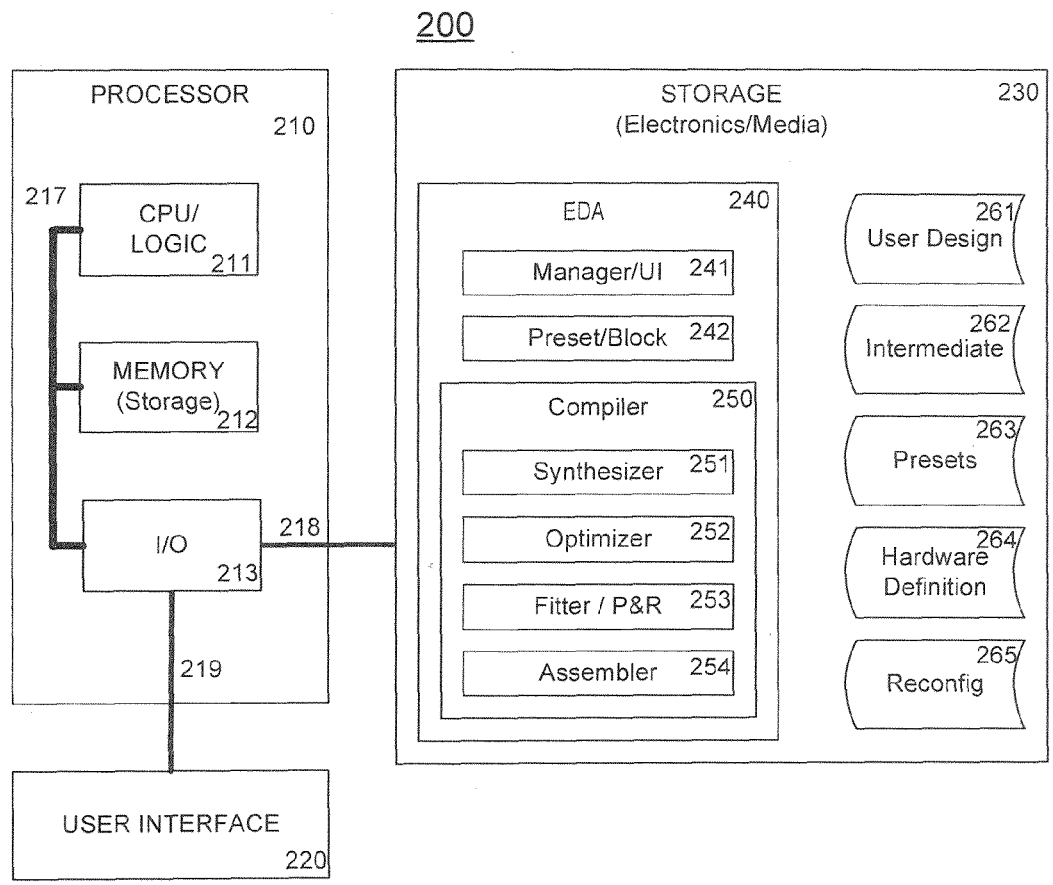
FIG. 2 is a block diagram of a superior EDA computer system.

FIG. 2 is a block diagram of a superior EDA computer system. EDA computer system 200 includes processor 210, user interface 220, and storage 230. Processor 210 further includes the CPU/logic block 211, memory/storage block 212, and I/O block 213. In one embodiment, CPU/logic block 211 includes one or more microprocessor circuits to fetch and execute instructions. CPU/logic block 211 is coupled by a signaling bus 217 to memory/storage, 212 and I/O 213. In one embodiment, memory/storage 212 is a primary type of storage including high-speed RAM devices to hold instructions and data for processing. Memory/storage 212 can, of course, include many and various types of storage devices for holding computer readable data (including program instructions). I/O 213 includes circuitry for interfacing input and output devices with CPU/logic 211, directly or via memory 212. I/O 213 is coupled via signal path 218 to storage 230, and via signal path 219 to user interface 220. User interface 220 includes one or more devices for presenting information to a user of the system and for receiving input from the user. In one embodiment user interface 220 includes a color graphics display screen, a keyboard, and a pointer device such as a mouse. Storage 230 includes one or more devices and any associated recording media used to store and access computer readable software and data. In one embodiment, storage 230 is persistent secondary storage provided by one or more hard disk drives, optical disk drives, flash devices, solid state storage units, tape drives, and associated media whether removable or not. In one embodiment, storage 230 includes multiple items of removable media, for example, multiple DVD-ROMs.

Storage 230 as shown in FIG. 2 includes EDA software files 240. EDA software 240 includes manager block 241, preset/cb block 242, and compiler block 250. Manager block 241 includes program instructions for controlling and coordinating the operation of multiple software components in the EDA system. One embodiment of manager block 241 further includes program instructions for providing a centralized interface with the user for the multiple EDA software components. The centralized interface includes uniform visual display and processing of user inputs (using, for example, UI devices 220). Preset/cb block 242 includes program instructions for reading and maintaining, and possibly effectuating, a set of one or more presets or control information blocks that indicate the selection of various options available in EDA processing. In one embodiment, preset/cb component 242 displays preset/cb information in a meaningful way using UI capabilities of manager block 241 and user interface devices 220. Preset/cb component 242 then accepts user input, again using manager/UI 241 and user interface devices 220, looking for desired modifications to preset/control information. Any desired modifications are analyzed for acceptability and, if acceptable, recorded in computer storage such as memory 212 or storage 230. Presets file 263 is an example of a control information file recorded in storage 230.

Compiler 250 includes program instructions for processing a high-level user design to produce a hardware implementation specification or design. Where the target hardware implementation is an FPGA such as that described in reference to IC 100 in FIG. 1, the hardware implementation specification may be a configuration information file for initially configuring a device of the target hardware device type. Compiler 250 of FIG. 2 includes a synthesizer 251, optimizer 252, fitter 253, and assembler 254. These compiler components perform a series of functions when executed. Synthesizer 251 reads a file holding a user design (that may already be partially processed), such as 261, and produces a functionally equivalent version of the design using a set of basic electronic circuit blocks. Optimizer 252 reads the output of synthesizer 251 and modifies the design, making reductions and simplifications where possible to minimize circuit elements and path lengths and to maximize speed. Fitter 253, reads the output of Optimizer 252 and places each electronic circuit block function in a specific location in the target chip design and routes the necessary signals between them (place and route). In doing so, Fitter 253 utilizes a hardware definition file, such as 264, that describes the circuitry resources of the target device type. Assembler 254, reads the resulting target chip design from Fitter 253 and generates information for the final hardware implementation. For example, where the final hardware implementation is an FPGA device, an Assembler module such as that found in the Quartus software from Altera Corporation of San Jose, Calif., generates a final bitstream that may be used to configure the operation of a complete FPGA. Reconfiguration information files, such as discussed herein, may be produced by the same or a different Assembler module. Each of the above compiler components may utilize one or more preset information files, such as 263, during its processing to ascertain selectable options and parameters in effect. Each of the above components may create its output as new files or as modifications to existing files, and that intermediate working files, such as 262, may be created, modified, and/or deleted to effect the overall process. One of skill recognizes that the compiler process may include more or fewer components and functions. For example, an optimizer component such as Optimizer 252 is not required, or may be subsumed to some degree within a synthesizer such as 251.

Further, one of skill will appreciate that the word "file" or "dataset" as used herein intends its broad interpretation applicable to any logical or physical block of stored or buffered data susceptible to computer processing, regardless of size, permanence, organization, or complexity. A file may be variously designated in a computer system as a stream, a pipe, a file, a dataset, a table, a database, a RAM block, a hard disk extent, a byte sequence, or the like, for example. A file may be unified by virtue of an identity (e.g., a filename or a location (e.g., contiguous bytes), for example.

The processing logic of the EDA system depicted in FIG. 2 includes EDA software 240 that is executed by processor 210. In other embodiments, the processing logic of the EDA system may be implemented as circuitry designed specifically to perform EDA processing (such as an ASIC), or as the general-purpose circuitry of the one or more a PLD devices configured to perform EDA processing. The processing logic of the EDA system may also include a combination of these alternatives. Other alternatives are possible.

As discussed earlier, the compiler processing that takes a high-level user design and produces a corresponding hardware implementation specification relies on hardware definition information, such as hardware definition file 264. A hardware definition file provides a detailed description of the resources available in one or more particular target hardware device types. A particular hardware target device may be one of multiple different device types that belong to a common family of devices. A chip manufacturer may, for example, group a number of devices into a family that each have certain architectural or circuit design aspects in common. For example, a family may be constructed of a number of devices that have a common design for certain circuit blocks, such as logic, transceivers, memory, or I/O. These common circuit blocks are variously mixed or matched among the different members of the family. In one embodiment, hardware definition information for a device family includes device descriptions for conceptual pseudo-devices in addition to the device descriptions for actual or physical target device types that can be realized.

Figure 3:
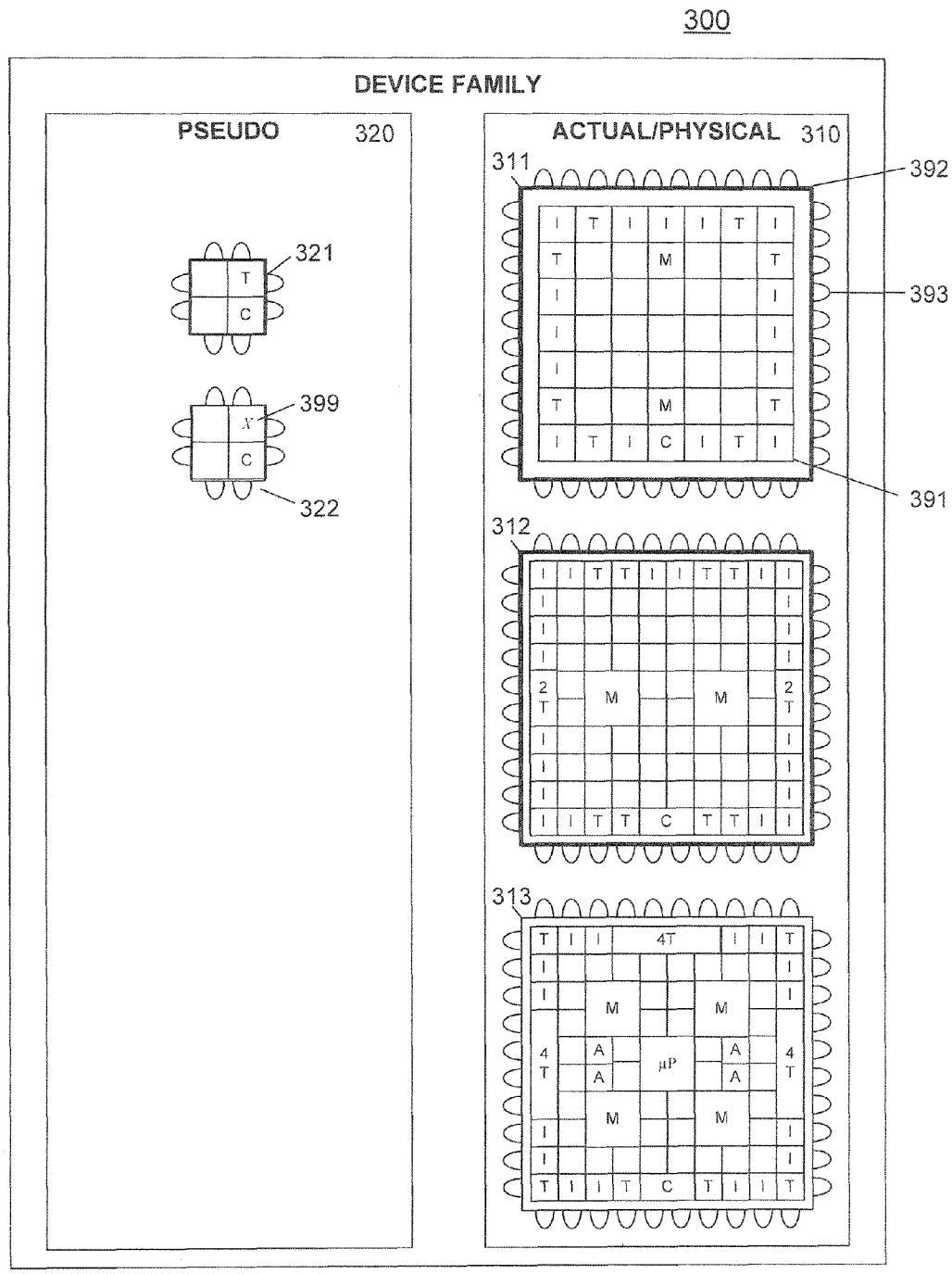
FIG. 3 illustrates a target device family that includes pseudo-devices.

FIG. 3 illustrates a target device family that includes pseudo-devices. Device family 300 includes a set 310 of physical target device types, and a set 320 of pseudo-device types. Each device type in FIG. 3 is illustrated as an IC package (e.g., 392) with connection pins (e.g., 393) and a die area layout (e.g., 391). Each die area layout is subdivided into a number of circuit blocks illustrating a relative distribution across the die area. The function of each circuit block within each device type is signified within FIG. 3 using a common denotation method. Unmarked circuit blocks contain general programmable logic circuitry. Blocks marked with an "I" contain input/output circuitry. Blocks marked with a "T" contain transceiver circuitry. Blocks marked with "2T" contain a transceiver circuitry duplex. Blocks marked with "4T" containing transceiver circuitry quadruplex. Blocks marked with an "M" contain memory circuitry of some size. Blocks marked with an "A" contain specialized math circuitry such as for performing high speed multiplication and accumulation functions. Blocks marked with "μP" contain dedicated microprocessor circuitry. Unlike the above blocks, blocks marked with "C" are not used to implement a user design but contain dedicated control circuitry for the chip, such as the circuitry that performs initial chip configuration.

Within illustrative device family 300, every device block sharing the same designation has the same functional capabilities. For example, an "I" circuit block in target device type 311 has the same input/output capabilities and options as an "I" circuit block in target device type 312.

It is further noted that in illustrative device family 300, the "2T" and "4T" transceiver gang circuit blocks represent twofold and fourfold, respectively, multiples of the functionality of a single "T" circuit block with the possibility of additional circuitry to allow them to operate in some coordinated fashion. For example, where a "T" block includes circuitry for a single channel (e.g., one transmitter and one receiver), a "2T" block includes circuitry that could support a 2-channel communication path, and a "4T" block includes circuitry that could support a 4-channel communication path. In one device family embodiment of ganged transceiver circuit blocks include substantially multiple duplicates of the single transceiver block circuit design, including its control register circuitry.

Accordingly, target device type 311 represents a "smallest" actual device in family 300 with 49 circuit blocks, including 1 control block, 2 memory blocks, 15 I/O blocks, 8 transceiver box, and 23 general logic blocks, with a largely symmetric distribution across the die. Target device type 312 represents a large actual device in family 300 emphasizing general logic capability, with 91 circuit blocks including 1 large control block, 2 large memory blocks, 22 I/O blocks, 8 transceiver blocks, 2 duplex transceiver blocks, and 56 general logic blocks, with a largely symmetric distribution across the die. Target device type 313 represents a large actual device in family 300 emphasizing data processing capability, with 75 circuit blocks including 1 large control block, 4 large memory blocks, 16 I/O blocks, 6 transceiver blocks, 3 quadruplex transceiver blocks, 40 general logic blocks, 4 math blocks, and 1 microprocessor block, with a largely symmetric distribution across the die.

Not all circuit blocks in a target device are necessarily used to implement a user design. Nonetheless, the complexity of a target chip imposes an EDA processing overhead that is substantial, and compiling even a small circuit design to a commercially practical physical device type consumes a substantial amount of computing resources. The resource consumption is magnified where different versions of a user design, varying minimally from one another, need to be compiled. Such is the case where a user needs to compile multiple different versions of a circuit design, varying from one another only in the operational parameter selections for a circuit block that the compiler reduces to values for a control register. A user may engage in such multiple compilations in order to identify proper sets of control register values to be used in dynamic reconfiguration.

An advantage of device family 300 is the inclusion of the set of pseudo-device types 320. A pseudo-device type is recognizable in the EDA system as a target device type. In one embodiment, recognition of the pseudo-device type by the EDA system is accomplished by providing hardware definition information (such as 264 of FIG. 2) that (i) is identified with the pseudo-device type and (ii) that includes at least the minimum necessary information required by EDA software specifications. While mimicking to the EDA system an actual device type that can be physically realized, pseudo-device type definitions have no actual physical counterpart. In one embodiment, pseudo-device descriptions define a PLD device having a single instance of a family circuit block type for which dynamic reconfiguration is possible, and having any additional circuitry required by the EDA system to achieve successful compilation processing, i.e., the successful production of particular dynamic reconfiguration information (such as a set of one or more values can be stored in a control register during dynamic reconfiguration.

The set of pseudo-device types 320 in target device family 300 includes pseudo-device types 321 and 322. Pseudo-device type 321 is illustrated having four circuit blocks. Device type 321 includes one instance of the family transceiver block type which in this discussion is presumed to include circuitry for a control register circuit that supports dynamic reconfiguration. A transceiver circuit block having a control register and dynamic reconfiguration capability was already discussed in reference to XCVR_0 (150) of FIG. 1. A control block and two general logic blocks are shown in device type 321. The control and general logic blocks are presumed to be required in this embodiment for the base EDA system to achieve a successful compile (alongside the transceiver block). Other embodiments of a pseudo-device type are also possible that may, for example, include multiple transceiver circuit blocks, additional circuit block types, or a small number of additional circuit blocks beyond that absolutely required to achieve a successful compile.

An instance of a circuit block type for which specific dynamic reconfiguration information is sought is called a targeted dynamic reconfiguration block. In one embodiment, a pseudo-device type includes a single targeted dynamic reconfiguration block. In another embodiment, a pseudo-device type may include multiple targeted dynamic reconfiguration blocks albeit all of the same block type. In another embodiment, a pseudo-device type may include multiple targeted dynamic reconfiguration blocks of different block types. In another embodiment, the number of targeted dynamic reconfiguration blocks of a particular type in a pseudo-device is fewer or not greater than the number of circuit blocks of that type in any of the actual device types, within the family, that include a circuit block of that type.

Pseudo-device type 322 is included to help illustrate the possible multiplicity and variability of pseudo-device types within a target device family. The circuit block configuration of pseudo-device type 322 is identical to that of pseudo-device type 321, already discussed, with the exception that the transceiver circuit block is replaced by a circuit block designated "X" "X" is used to indicate a placeholder where X in any particular pseudo-device type design could be replaced by any of the circuit block types within the device family that support dynamic reconfiguration.

Notably, each device type in device family 300, whether pseudo-or actual, is represented with target hardware definition information in the EDA system.

Figure 4:
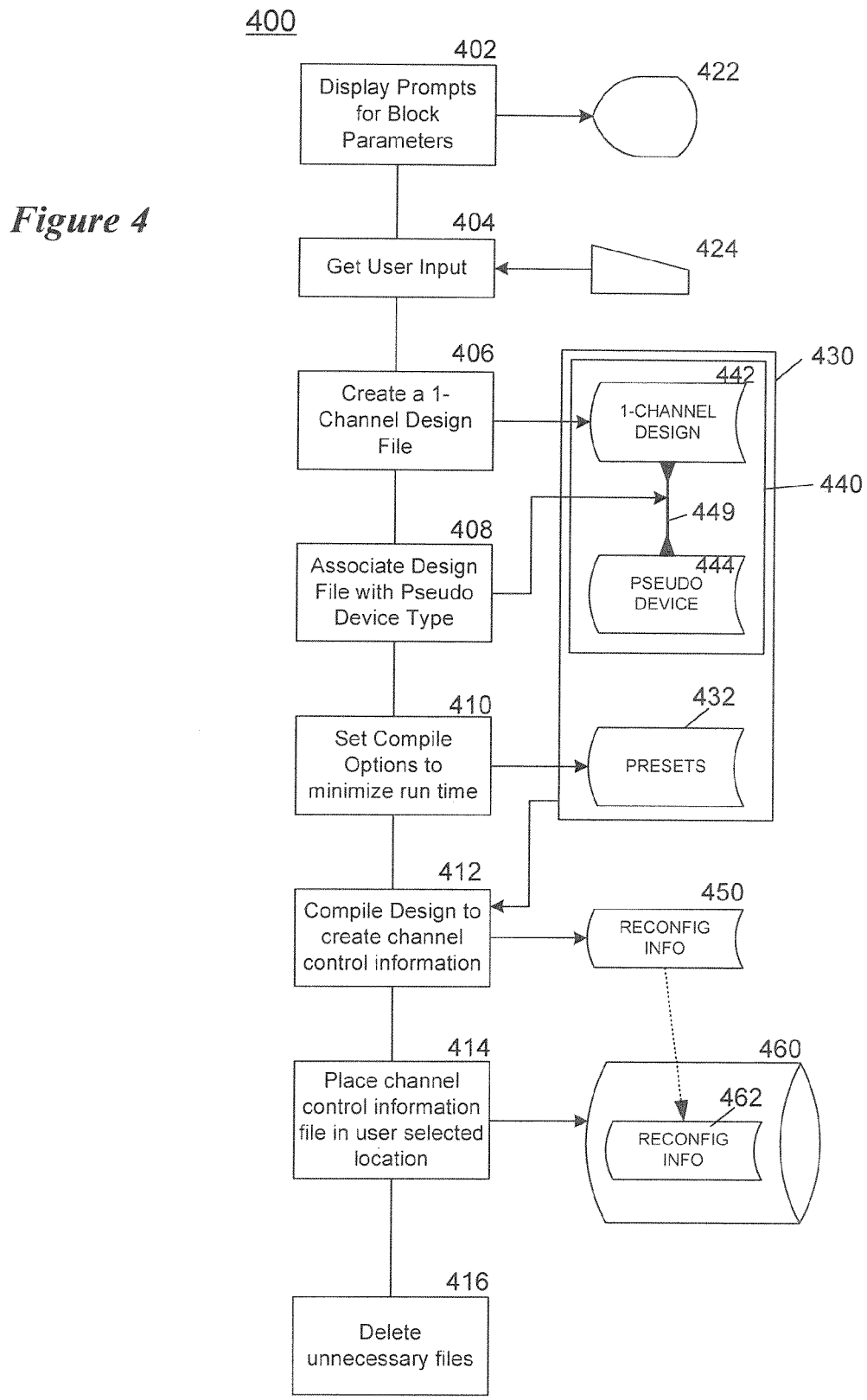
FIG. 4 is a flowchart for an embodiment efficiently producing a reconfiguration information file.

FIG. 4 is a flowchart for an embodiment efficiently producing a reconfiguration information file. In one embodiment, an EDA computer system using software and hardware (such as 200 of FIG. 2) perform process 400 of FIG. 4. At block 402 the system user is presented with a display prompting the user to enter, select, modify and/or approve one or more parameters specifying operational characteristics for a circuit block in a user design. The display is presented on graphical display device 422.

Figure 5:
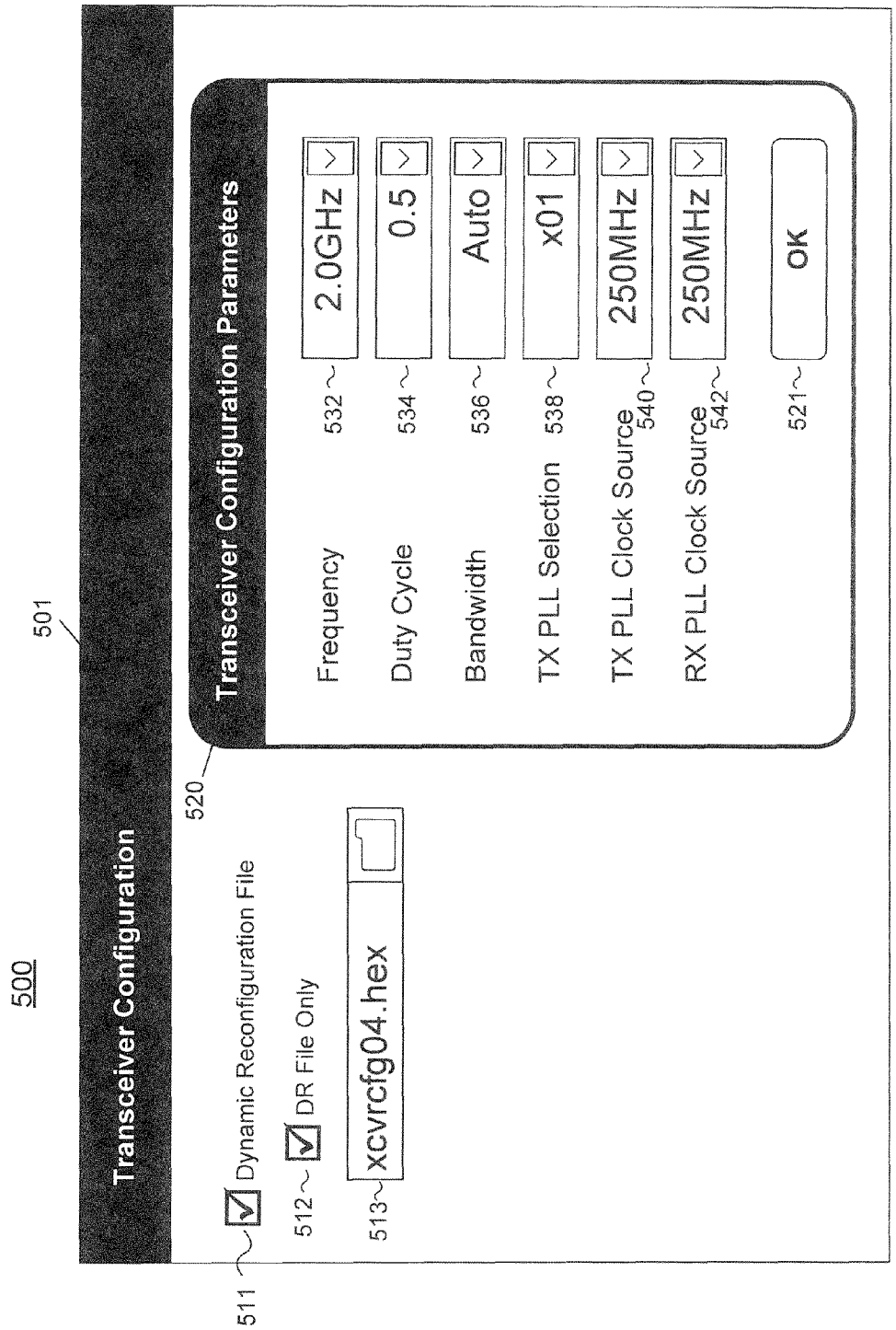
FIG. 5 depicts a sample screen display prompting user input.

FIG. 5 depicts a sample screen display prompting user input. Screen display 500 illustrates a sample screen display as might be presented to a user when prompting for information related to the customization of the operation of a transceiver circuit. Main window 501 includes selectable checkbox 511 labeled "Dynamic Reconfiguration File" that prompts the user to first indicate whether the transceiver circuit should be adapted to a static configuration or should be adapted to support dynamic reconfiguration. Selectable checkbox 512 labeled "DR File Only" is enabled for user interaction when checkbox 511 is selected, and may be otherwise grayed out to indicate its disabled state. Checkbox 512 permits a user in this embodiment to select whether current EDA system processing will produce any number of output files normally associated with the compile process, or whether retained output files will be limited as substantially as possible to the file containing dynamic reconfiguration information for a targeted dynamic reconfiguration block. For example, in one embodiment, selecting checkbox 512 permits a user to signal to the EDA system that customary log files, listing files, and resource utilization report files should be suppressed. Filename text box 513 permits the user to specify the name for a file to contain dynamic reconfiguration information resulting from EDA system processing.

GUI window 520 may be presented to a user to prompt for information regarding certain desired operating settings for a transceiver circuit block, including operating information that may be put into effect by dynamic reconfiguration of a transceiver. GUI window 520 may be incorporated into main window 501 or may be, for example, a pop-up window. Combo box GUI element 532 prompts a user to specify a value for transceiver frequency. Combo box GUI element 534 prompts a user to specify a value for transceiver duty cycle. Combo box GUI element 536 prompts a user to specify a value for the transceiver bandwidth setting. Combo box GUI element 538 prompts the user to specify a value for the transceiver TX PLL selection. Combo box GUI element 540 prompts the user to specify a value for the transceiver TX PLL clock source. Combo box GUI element 542 prompts the user to specify a value for the transceiver RX PLL clock source. Each of the aforementioned combo boxes appearing in window 520 has a corresponding text label indicating to the user the transceiver parameter associated with the combo box.

GUI button element 521 permits a user to signal satisfaction with the displayed information.

One of skill in the art will appreciate that FIG. 5 is only one illustrative example of user prompting and interaction. Information presentations are subject to a wide variety of means, designs, and appearances, and prompting information need not necessarily be conveyed using a graphical user interface. The information displayed and the interactivity supported is, of course, tailored to the needs and objectives of a particular implementation. For example, prompting information content is likely to vary when addressing different transceiver circuit blocks and different circuit block types, different target devices and device families, and different EDA systems. Accordingly, FIG. 5 is intended to help convey an understanding by useful example.

Returning to FIG. 4, the system user responds to the prompting display of 402 at block 404. The user responds by using any of a variety of input devices available in the EDA system (424). In one embodiment, 424 includes a keyboard, a touchscreen, and a mouse, as available options. At 406, the information provided earlier by the user regarding operational characteristics for a circuit block is used in the formation of a file describing circuit design information. The pseudo-device descriptor file 440 includes user design-specific information 442. In this example, which illustrates by reference to a device-type embodiment with a dynamically reconfigurable transceiver circuit block, user design file portion 442 specifies a single transceiver channel and minimum additional circuitry as may be required by the EDA system. At 408, an association 449 is made between user design information portion 442 of the pseudo-device descriptor and information regarding a pseudo device type 444 as needed to specify the target hardware device to the compiler. One of skill in the art recognizes that many alternatives are possible for making an association such as 449. For example, association 449 in one embodiment is effected by storing the name of a hardware definition information file for the pseudo device type (e.g. 264 of FIG. 2) in pseudo device descriptor 440. In another embodiment, association 449 is effected by copying the hardware definition information file contents for the pseudo device type (e.g., 264 of FIG. 2) into pseudo device descriptor 440. Many variations and alternatives are possible. In any event, user circuit design file 440 of the presently discussed embodiment includes sufficient data to inform EDA compiler components of the targeted pseudo device type and user specifications required for an implementation of the pseudo device-type.

At 410, run options are set for the compiler in order to minimize resources consumed in producing a dynamic reconfiguration information file. In one embodiment, this is accomplished by determining option settings recorded in a presets file 432. Presets files were discussed earlier in relation to presets/cb file 263 of FIG. 2. Contents of the presets file can be adjusted automatically or in response to user input such as described earlier in relation to checkbox GUI elements 511, 512 of FIG. 5. Appropriate resource conservation measures in an EDA system embodiment may include output file suppression, intensive analysis suppression, or report generation suppression, for example. The modification of presets information can augment the speed and resource savings achieved alone by the use of pseudo device type target hardware definitions.

At 412, the EDA system compiler processes input files 430, including circuit design file 440 and presets file 432, to produce a dynamic reconfiguration information file 450 in primary storage. Continuing with the illustrative discussion of one particular transceiver example, dynamic reconfiguration information file 450 includes information related to the content to be loaded into a transceiver control register during a dynamic reconfiguration operation. In one embodiment reconfiguration information file 450 consists entirely of the precise values to be loaded into a transceiver control register. In another embodiment, reconfiguration information file 450 consists of exact values to be loaded into certain elements of a transceiver control register along with placeholder values for other elements of the transceiver control register that will be substituted before loading. In one embodiment including such placeholder values, the placeholder values represent logical values that are substituted with physical values.

In one embodiment including such logical values, the logical values are index values that identify a particular member of a set. For example, in one embodiment one logical value may index a set of multiplexed clock signal sources available to a transceiver, in accordance with a pre-hardware user design specification. Then, during dynamic reconfiguration, the logical value is substituted for a value that selects the appropriate physical clock signal, in accordance with the hardware implementation. Such substitution or translation may be conditioned upon one or more factors. Examples include the relative position of the circuit block within the PLD, the relative position of the control register within a group of control registers, the relative position of the circuit block within the set of circuit blocks of that type, or the relative position of the circuit block within a multiplex of such circuit blocks (e.g., the 2T and 4T blocks discussed in relation to FIG. 3).

In yet another embodiment, reconfiguration information file 450 includes actual and/or placeholder control register information values and metadata. Metadata may include, for example, a device family identifier, a circuit block identifier, a version identifier, an EDA system identifier, a data length value, a data offset value, tag information, or the like. In yet another embodiment, reconfiguration information file 450 includes actual and/or placeholder dynamic reconfiguration information values and metadata, including reconfiguration information for multiple control block types. One of skill in the art appreciates the breadth of implementation possibilities for embodying this and other subject matter disclosed herein.

At 414, reconfiguration information file 450 is copied to a file 462 located on secondary storage 460. File 462, in one embodiment, is identified by file name specified by the user in conjunction with a GUI element such as filename box 513 of FIG. 5. At 416, temporary work files and the like, used to effect compiler processing for the creation of the reconfiguration information file, are deleted.

As previously noted, an embodiment of the process depicted in FIG. 4 may generate a reconfiguration information file 450 that contains no physical index values. Any index values within the reconfiguration information are logical index values. When a user design for an actual target device type that includes support for dynamic reconfiguration is compiled, the resulting hardware design implementation includes needed logic circuitry to map logical index values to physical index values as part of its dynamic reconfiguration circuitry operation.

Figure 6:
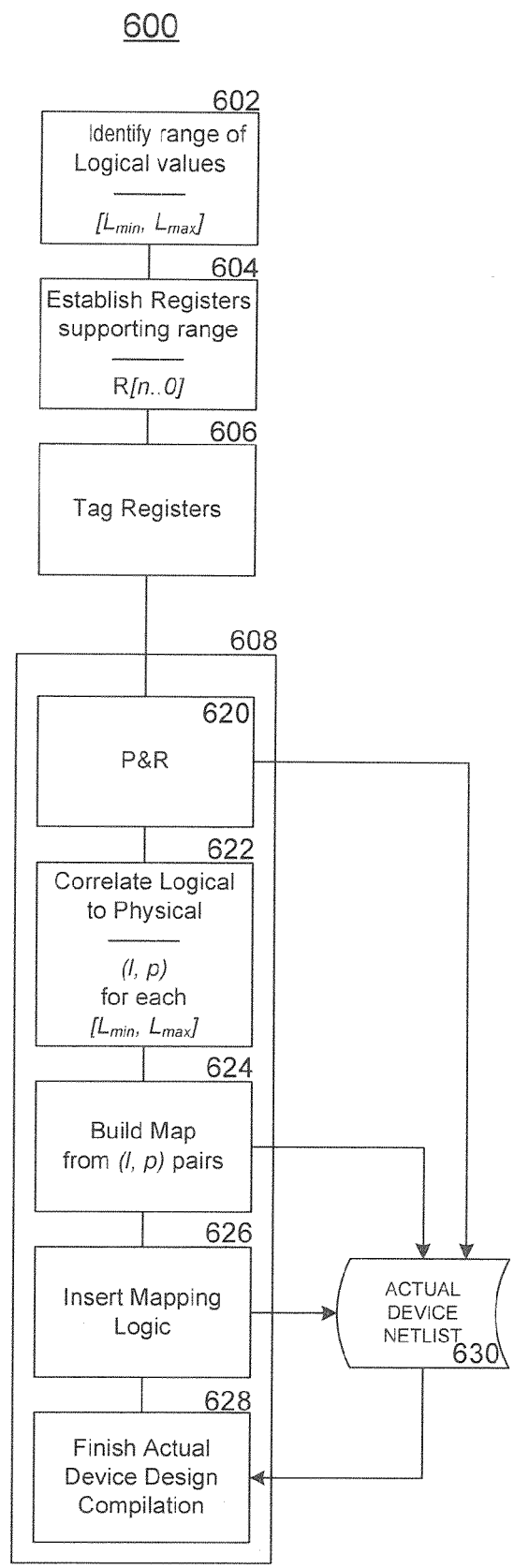
FIG. 6 is a flowchart for incorporating logical-to-physical mapping support.

FIG. 6 is a flowchart for incorporating logical-to-physical mapping support. At block 602 of process 600 a range of possible logical values is identified. In one embodiment the range of values is continuous so the range is can be completely identified using its minimum and maximum values, $L_{min}$ and $L_{max}$, respectively, with the range denoted as $[L_{min}, L_{max}]$. For example, in one transceiver circuit block embodiment that supports the selection of a receiver clock signal from among four clock signal sources using a multiplexer, the associated range of logical values may be specified as 10, 31. At 604, register circuitry sufficient to store the complete range of logical values is established within the full-chip user design, i.e., the user design for implementation in an actual target device type. In one embodiment, the register circuitry includes a sufficient number of a 1-bit register elements to represent the range of logical values in binary digital form. Using the previous example, where the logical range is denoted [0, 3], register circuitry for two 1-bit register elements is inserted into the user design, as two binary bits can represent the four numerical values (i.e., 0, 1, 2, and 3). Using the notation R[n . . . 0], where n is the total count of the register elements minus 1, the register circuitry of our example is denoted as R[1 . . . 0]. At 606, the established register circuitry is tagged as necessary to ensure proper processing during compilation. For example, in one embodiment register circuitry is tagged so that logic synthesis and optimization processing does not eliminate the register circuitry from the design.

The preceding portion of process 600 is carried out in the EDA system before design compilation. In one EDA system embodiment, 602-606 are carried out in response to a user design choice indications made using a GUI. The user design choices include an indication for dynamic reconfiguration support for at least one circuit block. The subsequently described portion of process 600 is carried out by the one or more components of the EDA system compiler 608. Much of this processing utilizes a stored representation 630 of the nascent hardware implementation to effect the user design being compiled. One of skill in the art recognizes the many embodiments that are possible for stored representation 630, and that the stored representation may involve many files, different files over time, modification of existing files, and the like, to achieve a computer readable description of a hardware implementation. In one embodiment, the structure of the data describing the hardware implementation is a netlist.

At 620, a fitter performs placement and routing for a synthesized user design into the target hardware device resources. The processing of 620 assigns specific physical circuitry in the actual target device type to implement the circuit functions specified in a logical representation of the user design. Accordingly, as a result of fitter processing, a logical-to-physical correlation results. For example, after fitting it is known within the EDA system that a transceiver circuit block identified as the first transceiver block in a logical version of the user design (e.g., XCVR_0) will be implemented using the third physical transceiver in the target hardware device (e.g., PHY_XCVR_2). (One of skill understands that the correlation need not always be on a one-to-one basis but is described as such here for simplicity.) And again, after fitting it is known that a clock signal source identified as the third clock in a logical design (e.g., CLK2) will be implemented using the second physical clock source in the target hardware device (e.g., PHY_CLK1).

At 622, the physical correlation is found for each of the logical values (identified earlier 602) using the logical-to-physical information resulting from fitter processing. In the presently described illustrative embodiment, each such correlation is denoted by (l, p), where is one of the logical values in range [$L_{min}$, $L_{max}$] and p is a physical value determined by fitter processing. A correlation is made for each value in the range [$L_{min}$, $L_{max}$].

At 624, physical circuitry is defined to represent a correlation table which contains each of the (l, p) pairs. In one embodiment, this correlation map is defined using look up table (LUT) circuitry from within the general user programmable logic portion of the target hardware device. Such LUT circuitry is often widely available and efficiently designed within a PLD. In this embodiment, the LUT input(s) carry one of the logical values, l, during operation, and in response the LUT output(s) present the corresponding p value, thus mapping the logical to the physical. In another embodiment, the correlation map is defined using general programmable logic elements configured to operate in a similar fashion as a read-only memory (ROM) structure. These and other embodiments are possible.

At 626, physical circuitry is defined to apply the correlation map of 624 to dynamic reconfiguration information values during a dynamic reconfiguration of an operating chip. In one embodiment, certain dynamic reconfiguration information values are loaded into the physical circuitry implementing register elements, such as R[n . . . 0] discussed earlier in relation to 604. Output signals representing the stored values of the physical register elements are continuously or switchably connected to inputs of the correlation map circuitry introduced at 624. Accordingly, the correlation map circuitry can present at its outputs during operation the mapped, translated, or correlated p value corresponding to the l value stored in physical R[n . . . 0]. Such output signals from the correlation map circuitry in one embodiment are designated R'[n . . . 0].

At 628, additional EDA system compilation processing is performed to produce a configuration information file for the targeted physical device type. The configuration information file can subsequently be loaded into a PLD chip of the targeted type to implement the circuit functionality of the user design, including dynamic reconfiguration of one or more circuit blocks. A dynamic reconfiguration operation may include use of dynamic reconfiguration information produced by a process such as that previously discussed and illustrated in relation to FIG. 4. A dynamic reconfiguration operation may further include the exercise of logical-to-physical mapping circuitry such as discussed and illustrated in relation to FIG. 6.

The foregoing description sets forth various embodiments with their associated details in order to explain and illustrate inventive subject matter. The foregoing description does not limit the scope of what the inventor claims but rather conveys an understanding that allows one of skill in the art to apprehend and appreciate the many alternatives and options that can be employed to implement inventive subject matter.

What is claimed is:

1. An EDA system for generating reconfiguration information for a PLD, comprising:
    first processing logic for establishing a descriptor for a pseudo device using customization information for a circuit block having a type, wherein the pseudo device is associated with a target device family comprising said pseudo device and at least one actual device, and wherein definition information associated with said pseudo device mimics an actual device type that can be physically realized and wherein said definition information does not correspond to a physical product instance; and
    second processing logic for compiling said descriptor to produce a reconfiguration information dataset for a circuit block of said type.

2. The EDA system of claim 1 wherein said pseudo device comprises fewer circuit block instances of said type than said at least one actual device in said target device family.

3. The EDA system of claim 2 wherein said pseudo device comprises no more than one circuit block instance of said type.

4. The EDA system of claim 2 wherein said circuit block is a transceiver circuit block type.

5. The EDA system of claim 4 wherein said reconfiguration information comprises a control register value.

6. The EDA system of claim 5 wherein said control register value comprises a logical index value.

7. The EDA system of claim 6 wherein said logical index value is a PLL index.

8. The EDA system of claim 7 wherein said logical index value is a clock index.

9. The EDA system of claim 4 wherein said descriptor comprises information indicating fixed pin assignments.

10. A method in an EDA system for generating reconfiguration information for a PLD, comprising:
displaying prompting information to a user identifying a reconfiguration option for a circuit block having a type;
accepting user input information corresponding to said reconfiguration option;
establishing a definition for a pseudo device in computer storage using said user input information, wherein the pseudo device is associated with a target device family comprising said pseudo device and at least one actual device, and wherein said definition mimics an actual device type that can be physically realized and wherein said definition does not correspond to a physical product instance; and
processing said definition to produce reconfiguration information for a circuit block of said type.

11. The method of claim 10 wherein said pseudo device comprises the lowest count of circuit block instances of said type of any device in said target device family having an instance of said type.

12. The method of claim 10 wherein said definition comprises HDL statements.

13. The method of claim 11 wherein said circuit block is a communications channel circuit block type.

14. The method of claim 13 wherein said reconfiguration information comprises control register contents.

15. The method of claim 14 wherein said control register contents comprise a logical index value.

16. The method of claim 15 wherein said logical index value is a PLL index.

17. The method of claim 16 wherein said logical index value is a clock index.

18. The method of claim 14 wherein said reconfiguration information comprises said control register contents in substantial proportion and is stored as a computer-readable file.

19. A non-transitory computer-readable medium for EDA computing, comprising:
computer code for displaying prompting information to a user and for accepting corresponding user information specifying a reconfiguration option for a function block having a type; and
computer code for generating a specification for a pseudo device in computer storage using said user information, wherein the specification is associated with a target device family comprising said pseudo device and at least one physical device, and wherein definition information associated with said pseudo device mimics an actual device type that can be physically realized and wherein said definition information does not correspond to a physical product instance.

20. The non-transitory computer-readable medium of claim 19 wherein each physical device in said target device family comprises a greater number of function block instances of said type than said pseudo device.

21. The non-transitory computer-readable medium of claim 20 wherein said function block type is associated with a communications channel.

22. The non-transitory computer-readable medium of claim 21 wherein said reconfiguration option is associated with one or more control storage elements of said function block type.

23. The non-transitory computer-readable medium of claim 22 wherein said control storage elements relate to selective coupling with a PLL circuit.

24. The non-transitory computer-readable medium of claim 22 wherein said control storage elements relate to selective coupling with a clock circuit.

25. The non-transitory computer-readable medium of claim 19 further comprising computer code for generating a function block reconfiguration data file based on said specification.

26. The non-transitory computer-readable medium of claim 25 wherein each physical device in said target device family comprises a greater number of function block instances of said type than said pseudo device.

27. The non-transitory computer-readable medium of claim 26 wherein said function block type is associated with a communications channel.

28. The non-transitory computer-readable medium of claim 27 wherein said reconfiguration option is associated with one or more control storage elements of said function block type.

* * * * *